United States Patent
Chen et al.

(10) Patent No.: US 10,056,894 B2
(45) Date of Patent: Aug. 21, 2018

(54) DRIVE UNIT OF SEMICONDUCTOR ELEMENT

(71) Applicant: FUJI ELECTRIC CO., LTD., Kawasaki (JP)

(72) Inventors: Shuangching Chen, Matsumoto (JP); Shogo Ogawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 5 days.

(21) Appl. No.: 15/357,135

(22) Filed: Nov. 21, 2016

(65) Prior Publication Data
US 2017/0194954 A1 Jul. 6, 2017

(30) Foreign Application Priority Data

Jan. 5, 2016 (JP) ................. 2016-000627

(51) Int. Cl.
| | |
|---|---|
| *H03K 17/687* | (2006.01) |
| *H03K 17/082* | (2006.01) |
| *H02P 27/08* | (2006.01) |
| *H03K 17/04* | (2006.01) |
| *H03K 17/0412* | (2006.01) |
| *H03K 17/16* | (2006.01) |
| *H01L 27/02* | (2006.01) |

(52) U.S. Cl.
CPC ......... *H03K 17/0826* (2013.01); *H02P 27/08* (2013.01); *H03K 17/0406* (2013.01); *H03K 17/0412* (2013.01); *H03K 17/162* (2013.01); *H03K 17/168* (2013.01); *H01L 27/0255* (2013.01); *H03K 2217/0036* (2013.01)

(58) Field of Classification Search
None
See application file for complete search history.

(56) References Cited

U.S. PATENT DOCUMENTS

| | | | |
|---|---|---|---|
| 8,513,986 B2 * | 8/2013 | Maruyama | H03K 17/0828 326/82 |
| 8,916,882 B2 * | 12/2014 | Zushi | H02M 1/08 257/77 |
| 2015/0131350 A1 | 5/2015 | Isomura et al. | |

FOREIGN PATENT DOCUMENTS

| | | |
|---|---|---|
| JP | 2014-175994 | 9/2014 |
| WO | WO2013/157086 | 10/2013 |

* cited by examiner

*Primary Examiner* — Long Nguyen

(57) ABSTRACT

A drive unit of a semiconductor element including: a drive circuit for driving a control electrode of a voltage control semiconductor element to which a freewheeling diode is connected in anti-parallel; a resistor connected between the control electrode and the drive circuit; a capacitor having one terminal connected between the resistor and the control electrode; and a switch element connected between another terminal of the capacitor and a low-voltage-side electrode of the voltage control semiconductor element, wherein a control electrode of the switch element is connected to a connection point of the resistor and the capacitor.

4 Claims, 5 Drawing Sheets

1

DRIVE UNIT OF SEMICONDUCTOR ELEMENT

CROSS REFERENCE TO RELATED APPLICATIONS AND INCORPORATION BY REFERENCE

This application claims benefit of priority under 35 USC 119 based on Japanese Patent Application No. 2016-000627 filed on Jan. 5, 2016, the entire contents of which are incorporated by reference herein.

TECHNICAL FIELD

The present invention relates to a drive unit of a semiconductor element, which is applied to a power converter or the like.

BACKGROUND ART

Conventionally, a power converter using an IGBT (Insulated Gate Bipolar Transistor) that is a voltage drive semiconductor element is known (for example, WO 2013-157086 A1). In such a power converter, a switching arm is usually configured by serially connecting two IGBTs.

In each of the two IGBTs that configure the switching arm, in order to suppress increase of a current flowing in the IGBTs when the IGBTs become on states at the same time, a clamp circuit configured by a series circuit of a diode and a capacitor is connected to between a gate that is a control electrode of the IGBT and an emitter that is a low-voltage-side electrode of the IGBT.

The clamp circuit suppresses increase of a gate voltage Vge by charging in the capacitor a part of a current flowing into the gate through feedback capacitance between a collector that is a high-voltage-side electrode of the IGBT and the gate. The diode is inserted so as to prevent charges in the capacitor from flowing back to the gate. The diode suppresses fluctuation of the gate voltage when a PWM signal is applied to the gate of the IGBT.

SUMMARY OF THE INVENTION

However, in the conventional example described in WO 2013-157086 A1, the clamp circuit is configured by the series circuit of the diode and the capacitor, and an anode of the diode is connected to the gate of the IGBT. Thus, there are problems in that a charge voltage to the capacitor cannot be charged to only a voltage lower by a drop voltage in the diode, a range of an accumulation voltage is narrowed, and a reverse recovery surge voltage suppressing effect described below is decreased by this amount, and moreover, the capacitor is charged through the diode during turn-on of the IGBT, and thus, rising of the gate voltage is delayed, and turn-on loss is increased.

The present invention has been made in view of the above-described problems of the conventional example described in WO 2013-157086 A1, and an object of the present invention is to provide a drive unit of a semiconductor element, which can reduce turn-on loss while suppressing a reverse recovery surge voltage of a voltage control semiconductor element.

In order to achieve the object mentioned above, according to one aspect of the present invention, there is provided a drive unit of a semiconductor element including: a drive circuit for driving a control electrode of a voltage control semiconductor element to which a freewheeling diode is connected in anti-parallel; a resistor connected between the control electrode and the drive circuit; a capacitor having one terminal connected between the resistor and the control electrode; and a switch element connected between another terminal of the capacitor and a low-voltage-side electrode of the voltage control semiconductor element, wherein a control electrode of the switch element is connected to a connection point of the resistor and the capacitor.

According to one aspect of the present invention, turn-on loss can be reduced while suppressing a reverse recovery surge voltage of a voltage control semiconductor element to which a freewheeling diode is connected in anti-parallel.

The object and advantages of the invention will be realized and attained by means of the elements and combinations particularly pointed out in the claims. It is to be understood that both the foregoing general description and the following detailed description are exemplary and explanatory and are not restrictive of the invention.

DETAILED DESCRIPTION

Figure 1:
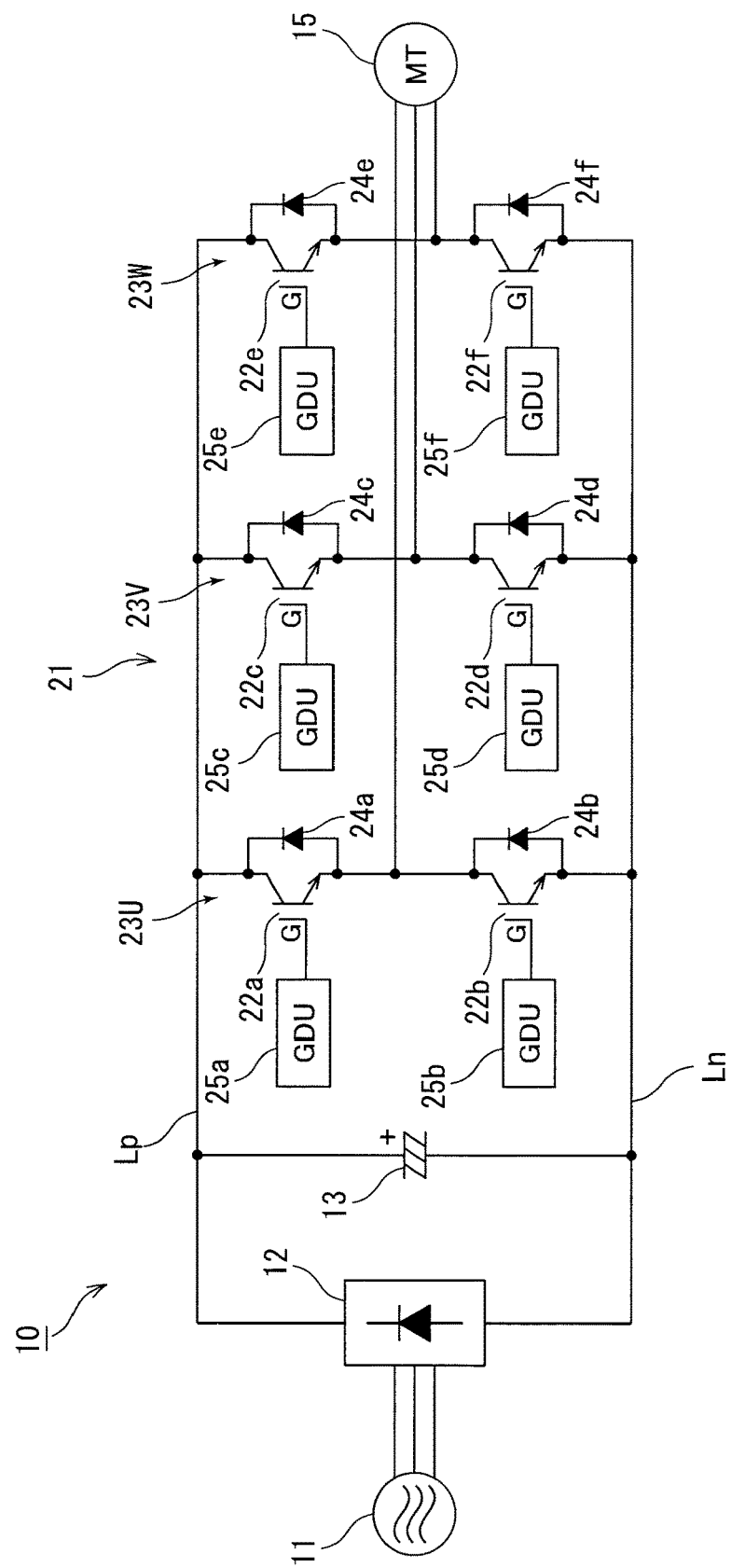
FIG. 1 is a circuit diagram illustrating a schematic configuration of an inverter with a gate drive unit of a semiconductor element according to a first exemplary embodiment of the present invention.

Next, one exemplary embodiment of the present invention will be described with reference to the drawings. In the following description of the drawings, the same or similar portions are denoted by the same or similar reference numerals.

In addition, the following exemplary embodiment illustrates devices and methods to embody the technical idea of the present invention, and the technical idea of the present invention does not limit the material, shape, structure, arrangement, and the like of a component to those described below. Various changes can be added to the technical idea of the present invention within the technical scope defined by claims.

Hereinafter, a drive unit of a semiconductor element according to one exemplary embodiment of the present invention will be described with reference to the drawings. The present exemplary embodiment is described by taking a voltage drive semiconductor element as the semiconductor element and a gate drive unit of a semiconductor element as the drive unit of a semiconductor element, as examples.

First, a power converter 10 with a gate drive unit of a semiconductor element according to the present invention will be described using FIG. 1.

As illustrated in FIG. 1, the power converter 10 is connected to a three-phase AC power source 11. The power converter 10 has a rectifier circuit 12 that full-wave rectifies three-phase AC power inputted from the three-phase AC power source 11, and a smoothing capacitor 13 that smooths the power rectified by the rectifier circuit 12. Although not illustrated in the drawing, the rectifier circuit 12 is configured by full-bridge connecting six diodes or full-bridge connecting six switching elements.

A positive-side line Lp is connected to a positive output terminal of the rectifier circuit 12, and a negative-side line Ln is connected to a negative output terminal of the rectifier circuit 12. The smoothing capacitor 13 is connected between the positive-side line Lp and the negative-side line Ln.

In addition, the power converter 10 includes an inverter circuit 21 that converts a DC voltage applied between the positive-side line Lp and the negative-side line Ln to a three-phase AC voltage. The inverter circuit 21 includes insulated gate bipolar transistors (hereinafter, referred to as IGBTs) 22a, 22c, and 22e that are connected to the positive-side line Lp and configure an upper arm part, as voltage control semiconductor elements, for example, and IGBTs 22b, 22d, and 22f that are connected to the negative-side line Ln and configure a lower arm part.

The IGBT 22a and the IGBT 22b are series-connected between the positive-side line Lp and the negative-side line Ln to configure a U-phase output arm 23U. The IGBT 22c and the IGBT 22d are series-connected between the positive-side line Lp and the negative-side line Ln to configure a V-phase output arm 23V. The IGBT 22e and the IGBT 22f are series-connected between the positive-side line Lp and the negative-side line Ln to configure a W-phase output arm 23W.

Freewheeling diodes 24a to 24f are respectively connected in anti-parallel to the IGBTs 22a to 22f. More specifically, cathodes of the freewheeling diodes 24a to 24f are respectively connected to collectors that are high-voltage-side electrodes of the IGBTs 22a to 22f, and anodes of the freewheeling diodes 24a to 24f are respectively connected to emitters that are low-voltage-side electrodes of the IGBTs 22a to 22f.

A connection part of the IGBT 22a and the IGBT 22b, a connection part of the IGBT 22c and the IGBT 22d, and a connection part of the IGBT 22e and the IGBT 22f are connected to a three-phase AC motor 15 that is an inductive load.

In addition, the power converter 10 has gate drive units (GDUs) 25a to 25f that separately control switching operations of the IGBTs 22a to 22f.

Output terminals of the gate drive units 25a to 25f are respectively connected to gate terminals that are control terminals of the IGBTs 22a to 22f.

Therefore, the inverter circuit 21 has a three-phase full-bridge circuit in which the U-phase output arm 23U, the V-phase output arm 23V, and the W-phase output arm 23W are connected in parallel, the gate drive units 25a and 25b that control a switching operation of the U-phase output arm 23U, the gate drive units 25c and 25d that control a switching operation of the V-phase output arm 23V, and the gate drive units 25e and 25f that control a switching operation of the W-phase output arm 23W.

Next, the drive unit according to the present exemplary embodiment will be described by taking the gate drive unit 25b as an example, using FIG. 2 while referring to FIG. 1. It is to be noted that the gate drive units 25a, 25c, 25d, 25e, and 25f have the same configurations as that of the gate drive unit 25b.

Figure 2:
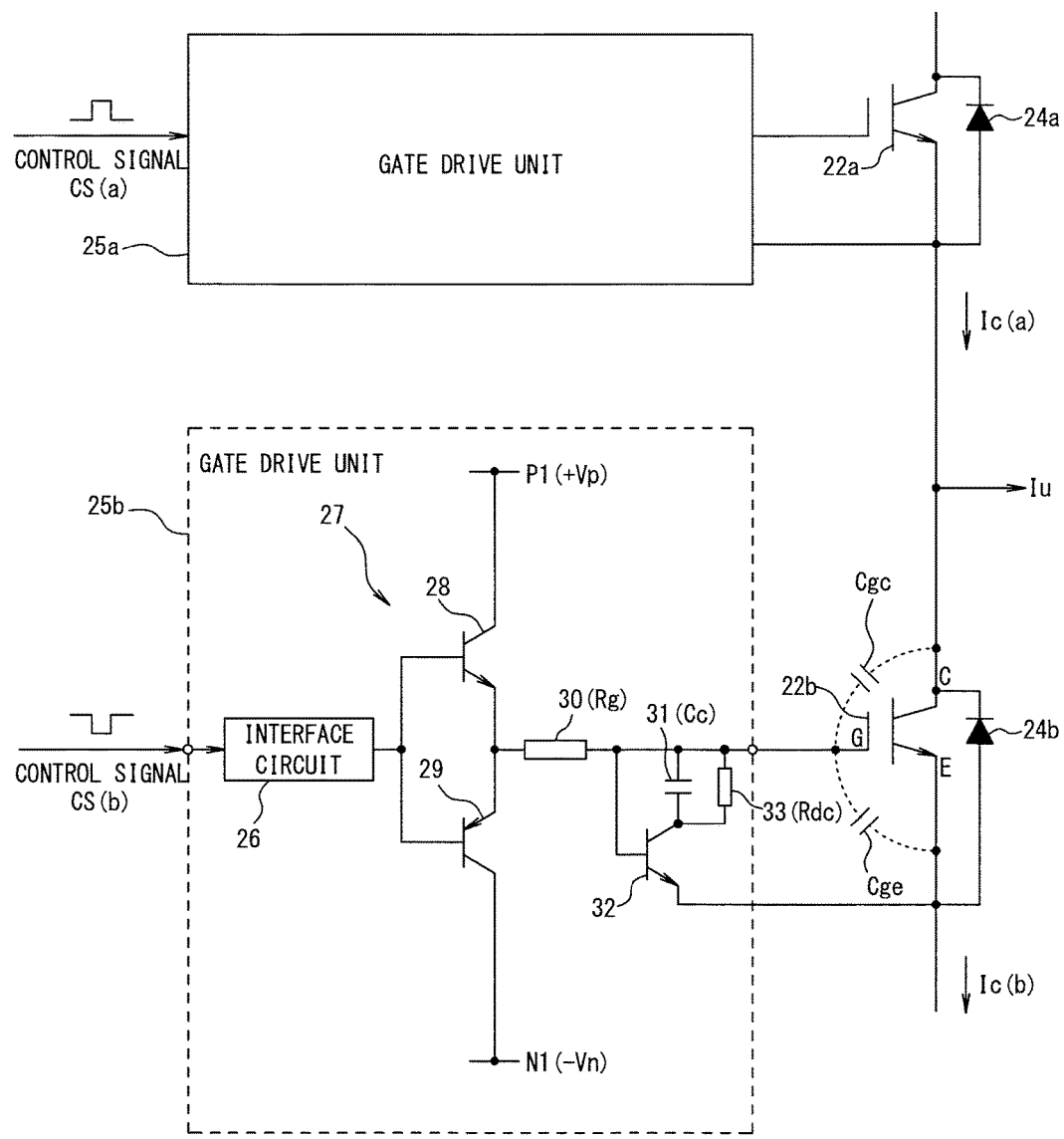
FIG. 2 is a circuit diagram illustrating an example of the gate drive unit of FIG. 1.

As illustrated in FIG. 2, the gate drive unit 25b includes an interface circuit 26 that receives, from the outside, a control signal CS(b) including, for example, a pulse-width modulation (PWM) signal, which on-off controls the IGBT 22b, and a gate drive circuit 27 that on-off controls the IGBT 22b by an internal control signal outputted from the interface circuit 26.

The gate drive circuit 27 is connected between a positive line P1 and a negative line N1, and an npn-type bipolar transistor 28 and a pnp-type bipolar transistor 29 are series-connected. In the npn-type bipolar transistor 28, a collector is connected to the positive line P1, an emitter is connected to an emitter of the pnp-type bipolar transistor 29, and a base is connected to the interface circuit 26.

In the pnp-type bipolar transistor 29, the emitter is connected to the emitter of the npn-type bipolar transistor 28, a collector is connected to the negative line N1, and a base is connected to the interface circuit 26.

Therefore, the npn-type bipolar transistor 28 becomes an on state when the internal control signal outputted from the interface circuit 26 is at a high level, and becomes an off state when the internal control signal is at a low level. On the other hand, the pnp-type bipolar transistor 29 becomes an off state when the internal control signal outputted from the interface circuit 26 is at a high level, and becomes an on state when the internal control signal is at a low level.

A connection point of the npn-type bipolar transistor 28 and the pnp-type bipolar transistor 29 is connected to the gate of the IGBT 22b through a gate resistor 30.

In addition, as illustrated in FIG. 2, in the gate drive unit 25b, one terminal of a capacitor 31 is connected between the gate resistor 30 and the gate electrode that is a control electrode of the IGBT 22b. The other terminal of the capacitor 31 is connected to, for example, the emitter that is a low-voltage electrode of the IGBT 22b via a switch element 32 configured by an npn-type bipolar transistor.

A control terminal (base terminal) of the switch element 32 is connected to a connection point between the gate resistor 30 and the capacitor 31.

Furthermore, a discharge resistor 33 having a larger resistance value compared to that of the gate resistor 30 is connected in parallel to the capacitor 31. A resistance value Rdc of the discharge resistor 33 is set to be a value capable of discharging charges charged in the capacitor 31 during off time of the pulse when the control signal CS (b) including the PWM signal inputted from outside has the maximum frequency.

Here, in the inverter circuit 21 of the power converter 10 to which the present invention is applied, the frequency of the PWM signal that is a gate drive signal is generally set to be 20 kHz or less.

Thus, when the frequency of the PWM signal is maximum, 20 kHz, one period is 1/20 kHz=50 µs, and when the duty ratio is 50%, on time and off time of the PWM signal are respectively 25 µs.

In addition, a relationship among the discharge time t, the time constant τ, and the discharge rate is:
  63.2% when t=τ;
  86.5% when t=2τ;
  95.0% when t=3τ;
  98.2% when t=4τ; and
  99.3% when t=5τ.

Here, in order to discharge the capacitor 31, the capacitor 31 may be discharged at the discharge time t=3τ and the discharge rate 95.0%, and the evaluated discharge time t may be the on/off time 25 µs or less (t<25 µs) determined by the maximum frequency of the inverter.

Capacitance Cc of the capacitor 31 may be one time to half of input capacitance Cies represented by a sum of gate-collector parasitic capacitance Cgc that parasitizes between the gate and the collector of each of the IGBTs 22a to 22f, and gate-emitter parasitic capacitance Cge that parasitizes between the gate and the emitter of each of the IGBTs 22a to 22f, and as described above, the resistance value Rdc of the discharge resistor 33 is set to be about ten times of a resistance value Rg of the gate resistor 30.

When assuming that the capacitance of the capacitor 31 is Cc=20 nF, the resistance value of the gate resistor 30 is Rg=1Ω, the resistance value of the discharge resistor 33 is Rdc=10Ω, and the time constant is τ, the discharge time t of the capacitor 31 is t=3τ=3×Rdc×Cc=3×10Ω×20 nF=600 ns.

Accordingly, the discharge time t is 600 ns, and thus, is sufficiently shorter than the on/off time of the PWM signal 25 µs, and the discharge is sufficiently possible during the off time of the PWM signal.

In addition, by providing the discharge resistor 33 so as to discharge the capacitor 31, if charging of the capacitor 31 is finished when the switch element 32 is in an on state, a gate voltage Vge is divided between the gate resistor 30 and the discharge resistor 33. Thus, when the gate voltage Vge of each of the IGBTs 22a to 22f, which is inputted from the gate drive circuit 27, is +Vp=15 V that is a positive voltage of the positive line P1, a voltage Vdc applied to the discharge resistor 33 is applied between the gate and the emitter of each of the IGBTs 22a to 22f.

Since Rg=1Ω and Rdc=10Ω, the voltage Vdc, i.e., the gate voltage Vge is Vge=Vdc=15 V×{10/(1+10)}=13.63 V.

Thus, when 15 V is required as the gate voltage Vge, by setting +Vp that is the positive voltage of the positive line P1 of the gate drive circuit 27 to 16.5 V, the gate voltage Vge=15 V is obtained as expressed by the following equation:

$$Vge=Vdc=16.5\times\{10/(1+10)\}=15\ V.$$

Next, an operation of the present exemplary embodiment will be described.

In the power converter 10, a three-phase AC voltage inputted from the three-phase AC power source 11 is converted into a DC voltage in the rectifier circuit 12, the DC voltage is smoothed by the smoothing capacitor 13 and inputted into the inverter circuit 21, and the DC voltage is converted into an AC voltage in the inverter circuit 21 and supplied to the three-phase AC motor 15.

If the motor is, for example, a three-phase induction motor, drive signals of 180° or 120° at an electrical angle are supplied to the upper arms of the U-phase output arm 23U, the V-phase output arm 23V, and the W-phase output arm 23W of the inverter circuit 21 while being shifted by 120°, and drive signals of 180° or 120° at an electrical angle are supplied to the lower arms thereof while being further advanced by 60°.

In the respective phase output arms 23U to 23W, when the IGBTs 22a, 22c, and 22e of the upper arms are in an on state, the IGBTs 22b, 22d, and 22f of the lower arms are in an off state. Dead time when the IGBTs of the upper and lower arms become the off state simultaneously is provided during turn-off when the IGBTs 22a, 22c, and 22e of the upper arms are shifted from the on state to the off state such that the IGBTs of the upper arms and the IGBTs of the lower arms do not become the on state simultaneously. On the other hand, dead time when the IGBTs of the upper and lower arms become the off state simultaneously is provided also during turn-off when the IGBTs 22b, 22d, and 22f of the lower arms are shifted from the on state to the off state.

A turn-on operation will be described by taking the IGBT 22b that configures the lower arm of the U-phase output arm 23U as an example. First, when the control signal CS (b) that is the PWM signal to be supplied to the gate drive unit 25b is in the low level state, the internal control signal to be outputted from the interface circuit 26 is also at the low level. Thus, the npn-type bipolar transistor 28 becomes the off state, and in contrast, the pnp-type bipolar transistor 29 becomes the on state.

Therefore, the gate electrode of the IGBT 22b is connected to −Vn (for example, −15 V) that is a negative voltage of the negative line N1 through the gate resistor 30 and the pnp-type bipolar transistor 29. Thus, as illustrated in FIG. 3, the gate voltage Vge of the IGBT 22b is the negative voltage −Vn, and the off state is maintained.

Figure 4:
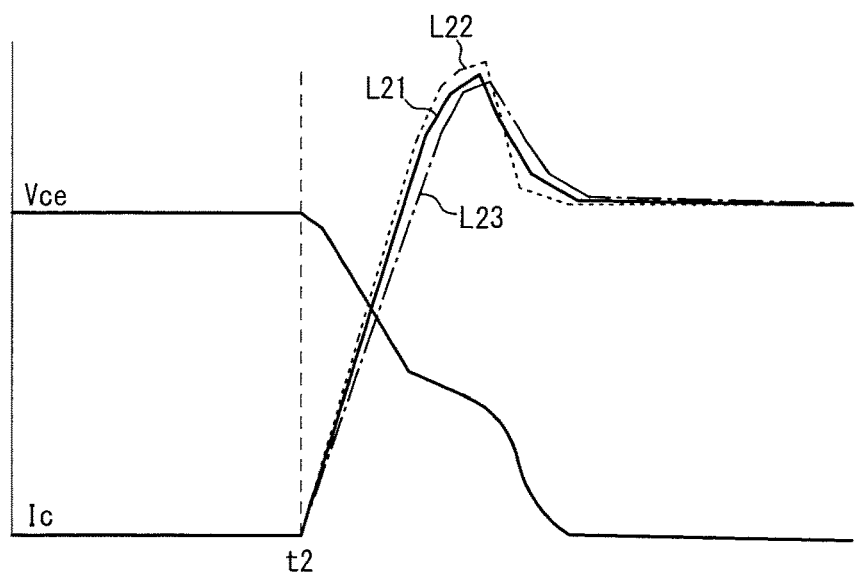
FIG. 4 is a waveform diagram illustrating turn-on characteristics of the gate drive unit of FIG. 2.

At this time, as illustrated in the left part of the solid line of FIG. 4, a collector-emitter voltage Vce of the IGBT 22b is a high voltage that is a voltage obtained by smoothing the output of the rectifier circuit 12 with the smoothing capacitor 13. In addition, as illustrated in the left part of the solid line of FIG. 4, a collector current Ic is zero.

Figure 3:
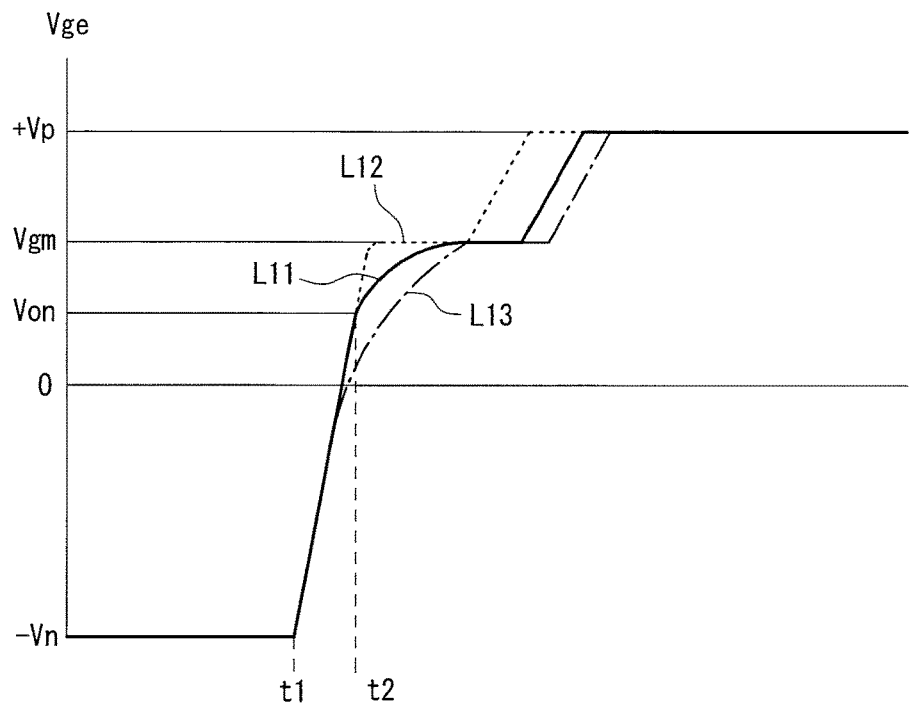
FIG. 3 is a waveform diagram illustrating a gate voltage waveform during turn-on of the gate drive unit of FIG. 2.

From the off state, when the control signal CS (b) to be inputted into the gate drive unit 25b is switched from the low level to the high level at time t1 in FIG. 3, the pnp-type bipolar transistor 29 becomes the off state, and in contrast, the npn-type bipolar transistor 28 becomes the on state. Thus, the positive voltage +Vp of the positive line P1 is applied to the gate electrode of the IGBT 22b through the npn-type bipolar transistor 28 and the gate resistor 30.

At this time, in an initial state, the gate voltage Vge increases while charging gate capacity of the IGBT 22b. Thus, as illustrated in FIG. 3, the gate voltage Vge increases from the negative voltage −Vn of the negative line N1. The gate voltage Vge at this time charges the gate capacitance through the gate resistor 30 having a relatively-small resistance value, and thus, increases at a relatively-large increase rate (dV/dt).

Then, when the gate voltage Vge reaches a threshold voltage Von of the switch element 32 at time t2, the switch element 32 becomes the on state. Thus, a part of a gate current separately flows into and accumulates in the capacitor 31. Accordingly, as illustrated by the characteristic line L11 illustrated by the solid line in FIG. 3, the increase rate (dV/dt) of the gate voltage Vge is decreased, and arrival time to a mirror voltage Vgm of the gate voltage Vge is delayed. Thus, rising of the IGBT 22b is delayed, and turn-on loss can be reduced compared to the characteristic line L13 illustrated by the chain line in the case where the switch element 32 is omitted and only the capacitor 31 is provided.

Here, the mirror voltage Vgm will be described. During the turn-on or turn-off of the IGBT, when the gate voltage Vge of the IGBT reaches the vicinity of the threshold voltage of the IGBT, a period called a mirror period in which the gate voltage Vge becomes flat so as to charge and discharge the gate-collector parasitic capacitance Cgc (having a larger effect than the actual capacitance value due to a mirror effect) of the IGBT is generated, and the mirror voltage Vgm means the gate voltage Vge during the mirror period. The mirror period is a period in which the collector-emitter voltage Vce varies, and is finished when the collector-emitter voltage Vce reaches a final value.

More specifically, when only the capacitor 31 is provided, during the turn-on of the IGBT 22b, the accumulation of charges in the capacitor 31 is started from the time when the gate voltage Vge starts to increase from the negative voltage −Vn, as illustrated by the characteristic line L13 of the chain line in FIG. 3. Thus, the increase rate dV/dt of the gate voltage Vge gradually becomes small from the starting time of the rising from the negative voltage −Vn. Therefore, time until the gate voltage Vge reaches the mirror voltage Vgm of the IGBT 22b becomes long, and the turn-on loss due to switching loss becomes large.

However, by connecting the switch element 32 to between the capacitor 31 and the emitter of the IGBT 22b in the present exemplary embodiment, as described above, while the switch element 32 maintains the off state, the increase rate (dV/dt) of the gate voltage Vge illustrated by the characteristic line L11 illustrated by the solid line becomes equal to the increase rate (dV/dt) of the gate voltage Vge illustrated by the characteristic line L12 illustrated by the dotted line in the case where the capacitor 31 itself is not provided.

Thus, the rising becomes steep, and then, when the switch element 32 becomes the on state, the increase rate (dV/dt) of the gate voltage Vge becomes small. Therefore, in the present exemplary embodiment, the time until the gate voltage Vge reaches the mirror voltage Vgm of the IGBT 22b becomes shorter compared to the case where only the capacitor 31 is provided, and thus, the switching loss can be reduced and the turn-on loss can be reduced.

In addition, when the gate voltage Vge reaches the mirror voltage Vgm, the collector current Ic of the IGBT 22b starts to increase from zero as illustrated by the characteristic line L21 illustrated by the solid line of FIG. 4, and the collector-emitter voltage Vce starts to decrease as illustrated by the solid line of FIG. 4. An increase rate (dI/dt) of the collector current Ic at this time becomes smaller compared to the characteristic line L22 illustrated by the dotted line in the case where the capacitor 31 is not provided. Thus, the maximum current during overshoot of the collector current Ic can be suppressed to be a smaller value than the maximum current during overshoot of the collector current Ic in the case where the capacitor 31 is not provided. It is to be noted that, when only the capacitor 31 is connected, as illustrated by the characteristic line L23 illustrated by the chain line in FIG. 4, the increase rate (dI/dt) during the increase of the collector current Ic can be made smaller, and the maximum current during overshoot can be more suppressed, but the turn-on loss is increased as described above.

As just described, in the present exemplary embodiment, the maximum current during overshoot during the increase of the collector current Ic is suppressed during the turn-on, so that energy to be accumulated in an inductance component including wiring inductance can be suppressed.

Next, the case where both the IGBT 22a that configures the upper arm and the IGBT 22b that configures the lower arm are in the off state and in a freewheeling state in which a freewheeling current If illustrated in FIG. 5 flows through the freewheeling diode 24b of the IGBT 22b that configures the lower arm by energy accumulated in a coil of the three-phase AC motor 15 will be described.

Figure 5:
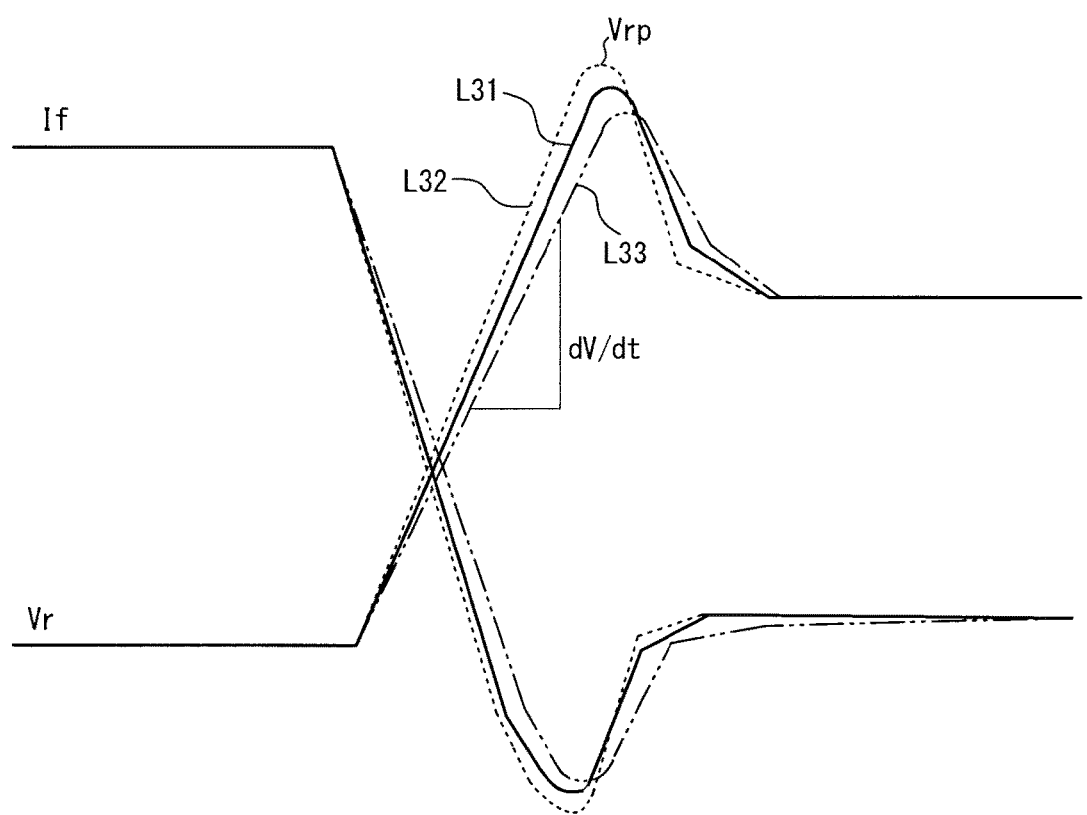
FIG. 5 is a waveform diagram illustrating reverse recovery operation characteristics of a gate drive circuit of FIG. 2.

In the freewheeling state, as illustrated in the left part of FIG. 5, an anode-cathode voltage Vr of the freewheeling diode 24b is zero (Strictly speaking, although only the forward voltage of the diode is dropped, it is a small value, and thus is neglected in FIG. 5.). It is to be noted that, regarding the freewheeling current If in FIG. 5, a current flowing in a direction opposite to the arrow of Ic (b) illustrated in FIG. 2 is assumed to be positive.

When the IGBT 22a that configures the upper arm is controlled to be in the on state from the freewheeling state, the freewheeling diode 24b is changed from a forward bias state to a state where a reverse bias voltage is applied. At this time, when the capacitors 31 are not provided in both the IGBTs 22a and 22b, as illustrated by the dotted line in FIG. 5, the freewheeling current If flowing in the freewheeling diode 24b decreases at a relatively-large decrease rate (−dI/dt). Then, a reverse recovery operation state in which the freewheeling current If exceeds zero to be a reverse recovery current flowing in the opposite direction is caused.

More specifically, in a state where a p-n junction of the freewheeling diode 24b is forward biased, an $N^-$ layer becomes a saturation state by injection of carriers, but when the reverse bias voltage is applied to electrodes of the diode, the p-n junction starts a blocking operation by reverse voltage recovery. However, the p-n junction cannot immediately make a transition from the saturation state of the carriers accumulated by the forward bias to the state where the reverse voltage is recovered, and regarding the excess carriers accumulated in the $N^-$ layer, electrons and holes are respectively discharged from the $N^-$ layer side and a P layer side from a p-n junction part in which a depletion layer is first recovered, and a current flows until the excess carriers accumulated in the $N^-$ layer disappear due to recombination. The current is observed as the reverse recovery current.

In the reverse recovery operation state, as the excess carriers are reduced and a reverse breakdown voltage of the p-n junction is recovered, the reverse recovery current is reduced and does not flow. Due to a decrease rate (−dIf/dt) of the reverse recovery current and parasitic inductance L' in the circuit, a reverse recovery surge voltage (=L'×dIf/dt) is generated. The reverse recovery surge voltage has a relatively-large peak value Vrp in the freewheeling voltage Vr, as illustrated by the characteristic line L32 illustrated by the dotted line in FIG. 5.

In contrast, by providing a series circuit of the capacitor 31 and the switch element 32 in each of the gate drive units 25a and 25b of the IGBTs 22a and 22b, the increase rate (dI/dt) of the collector current Ic of the IGBT 22a that is the upper arm during the turn-on is decreased, as illustrated in FIG. 4. Thus, in the IGBT 22b that is the lower arm, from the freewheeling state to the reverse recovery operation state, the decrease rate (−dIf/dt) of the freewheeling current If becomes smaller compared to the case where the capacitor 31 is not provided as illustrated by the solid line in FIG. 5. In addition, a peak value of the reverse recovery current in the reverse recovery operation state also becomes smaller compared to the case where the capacitor 31 is not provided.

Thus, the reverse recovery surge voltage is determined by the parasitic inductance L' in the circuit and the decrease rate (−dIf/dt) of the freewheeling current If as described above, and thus, the peak value Vrp of the reverse recovery surge voltage can be decreased compared to the case where the capacitor 31 is not provided as illustrated by the characteristic line L31 illustrated by the solid line in FIG. 5.

A decrease rate of the reverse recovery surge voltage in the present exemplary embodiment is smaller compared to a decrease rate in the case where only the capacitor 31 is provided (the characteristic line L33 illustrated by the chain line in FIG. 5), but a sufficient surge voltage suppressing effect can be obtained.

As described above, since capacitance of the capacitor 31 is added to the gate capacitance of the IGBT 22b when only the capacitor 31 is provided, regarding gate voltage characteristics during the turn-on, as the characteristic line L13 illustrated by the chain line in FIG. 3, rising of the gate voltage Vge is delayed, and the switching loss during the turn-on becomes large. Accordingly, gate capacitance discharge time during the turn-off also becomes long, and the switching loss during the turn-off becomes large.

However, according to the present exemplary embodiment, the capacitor 31 is connected between the gate and the emitter of the IGBT 22b only during the on period of the switch element 32, and the switching loss during the turn-on can be suppressed compared to the case where only the capacitor 31 is provided.

Furthermore, the switching loss during the turn-off can be suppressed similarly to the case where the capacitor 31 is not provided. More specifically, in the present exemplary embodiment, during the turn-off, the pnp-type bipolar transistor 29 becomes the on state, and the charges accumulated in the gate capacitance of the IGBT 22b are discharged through the gate resistor 30. At this time, since a current does not flow from the emitter to the collector of the npn-type bipolar transistor that configures the switch element 32 even when the switch element 32 is in the on state, regarding the charges accumulated in the capacitor 31, a discharge path of the capacitor 31 is not formed. Thus, during the turn-off, the switching loss is equal to that in the case where the capacitor 31 is not provided, and is not increased.

It is to be noted that the charges accumulated in the capacitor 31 are discharged during off time of one pulse of the PWM signal by the discharge resistor 33 having a larger resistance value compared to that of the gate resistor 30.

In addition, in the above-described conventional example, the capacitor is connected between the gate resistor and the gate electrode of the IGBT through the diode. Thus, the charge voltage of the capacitor is lowered with respect to the gate voltage Vge by the drop voltage of the diode, and the effect of suppressing the reverse recovery surge voltage is limited by this amount. In contrast, in the present exemplary embodiment, a base current has no limits, and an on voltage (emitter-collector voltage during turn-on) of the bipolar transistor is sufficiently small. Thus, the present exemplary embodiment is substantially equivalent to the case where the capacitor 31 is directly connected between the gate resistor 30 and the gate electrode of the IGBT 22b, and thus, the charge voltage of the capacitor 31 can be fully charged to the gate voltage Vge. Therefore, a larger reduction effect can be produced with respect to the reverse recovery surge voltage.

Figure 6:
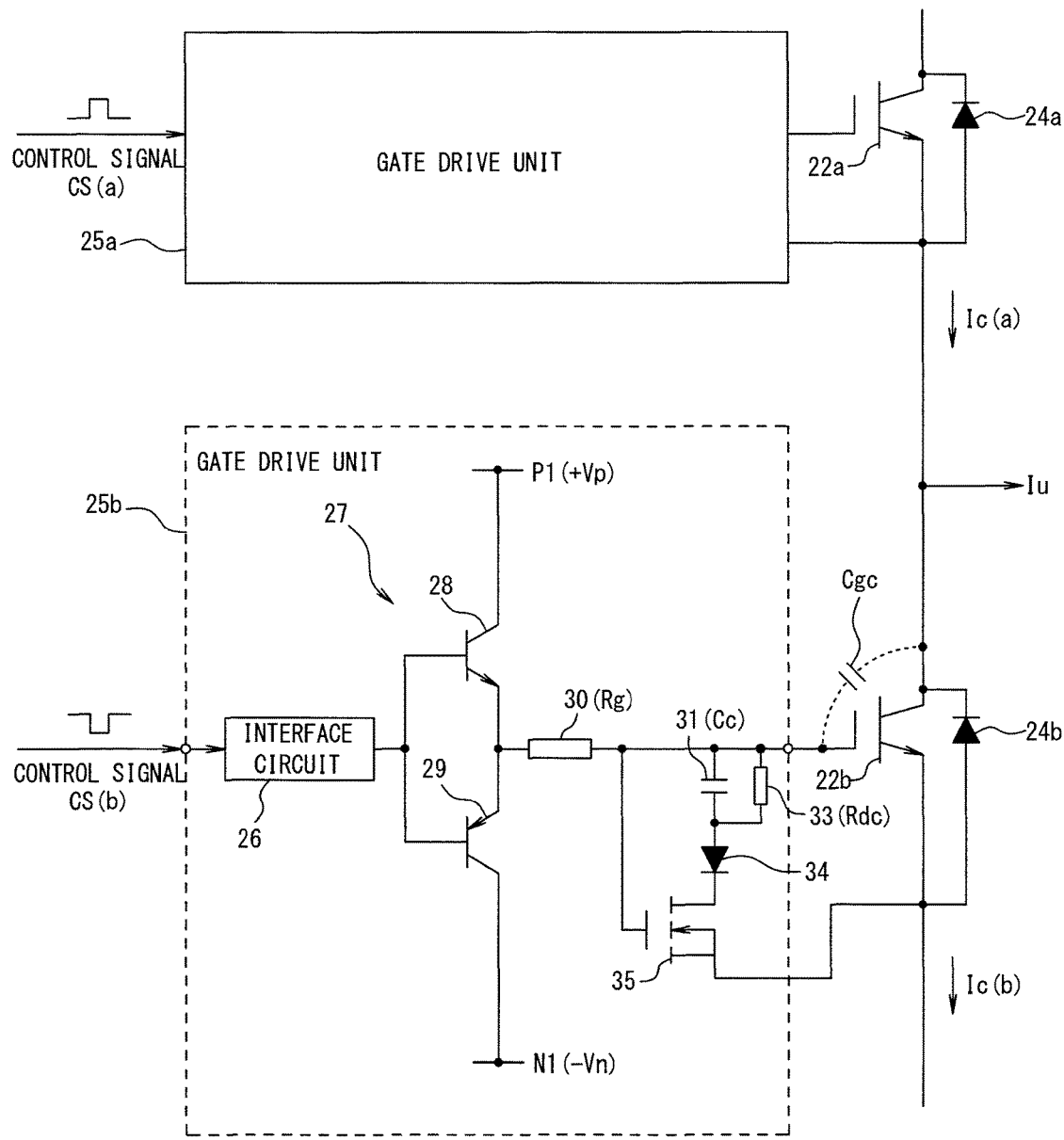
FIG. 6 is a circuit illustrating a modified example of the gate drive circuit.

It is to be noted that, although the case where the npn bipolar transistor is applied as the switch element 32 connected to the capacitor 31 has been described in the above-described exemplary embodiment, the present invention is not limited thereto, and a series circuit of a diode 34 and an n-channel MOSFET 35 may be applied in place of the npn bipolar transistor, as illustrated in FIG. 6.

The diode 34 may be provided between the capacitor 31 and the n-channel MOSFET 35, or between the n-channel MOSFET 35 and the emitter of the IGBT 22b as long as a current flowing toward the capacitor 31 from the emitter side of the IGBT 22b can be blocked.

As just described, by configuring the switch element 32 by the diode 34 and the n-channel MOSFET 35, substantially the same function effect as the above-described case where the npn-type bipolar transistor is applied can be obtained. In addition, by making a threshold voltage of the n-channel MOSFET 35 higher than a forward voltage of the diode, the turn-on loss can be suppressed compared to the above-described conventional example.

In addition, although the case where the power converter 10 includes the rectifier circuit that converts the three-phase AC power from the three-phase AC power source 11 into DC has been described in the above-described exemplary embodiment, the present invention is not limited thereto. More specifically, a single-phase AC power source can be applied, and moreover, a DC power source such as a battery can also be used in place of the three-phase AC power source 11.

The technical scope of the present invention is not limited to the illustrative exemplary embodiment illustrated and described in drawings, and includes all exemplary embodiments which produce effects equivalent to those intended by the present invention. Furthermore, the technical scope of the present invention is not limited to the combination of the features of the invention defined by claims, and can be defined by any desired combination of specific features among all disclosed features.

REFERENCE SIGNS LIST 10 power converter
11 three-phase AC power source
12 rectifier circuit
13 smoothing capacitor
15 three-phase AC motor
21 inverter circuit
22a to 22f IGBT
23U U-phase output arm
23V V-phase output arm
23W W-phase output arm
24a to 24f freewheeling diode
25a to 25f gate drive unit
26 interface circuit
27 gate drive circuit
30 gate resistor
31 capacitor
32 switch element
33 discharge resistor
34 diode
35 n-channel MOSFET

The invention claimed is:

1. A drive unit of a voltage control semiconductor element comprising:
a drive circuit for driving a control electrode of the voltage control semiconductor element to which a freewheeling diode is connected in anti-parallel;
a resistor connected between the control electrode and the drive circuit;
a capacitor having a terminal connected between the resistor and the control electrode; and
a switch element connected between another terminal of the capacitor and a low-voltage-side electrode of the voltage control semiconductor element, wherein
a control electrode of the switch element is connected to a connection point of the resistor and the capacitor.

2. The drive unit of the voltage control semiconductor element according to claim 1, further comprising:
a discharge resistor which is connected in parallel to the capacitor and has a larger resistance value compared to the resistor.

3. The drive unit of the voltage control semiconductor element according to claim 1, wherein
the switch element is an npn-type bipolar transistor.

4. The drive unit of the voltage control semiconductor element according to claim 1, wherein
the switch element is a series circuit of a diode and an n-channel MOSFET.

* * * * *